United States Patent [19]

Daniels

[11] Patent Number: 4,510,593

[45] Date of Patent: Apr. 9, 1985

[54] INFORMATION DISK OF GROOVED, METAL-COATED CROSSLINKED POLYMERIC LAYER

[75] Inventor: Michael P. Daniels, Hastings, Minn.

[73] Assignee: Minnesota Mining and Manufacturing Company, St. Paul, Minn.

[21] Appl. No.: 434,970

[22] Filed: Oct. 18, 1982

[51] Int. Cl.³ .......................... C08F 2/50; B32B 27/08; B32B 27/30

[52] U.S. Cl. ................ 369/283; 204/159.16; 369/288; 264/1.4; 525/303; 525/305; 428/64; 428/461; 428/462

[58] Field of Search .................. 204/159.16; 369/288, 369/283

[56] References Cited

U.S. PATENT DOCUMENTS

| | | | |
|---|---|---|---|
| 3,658,954 | 4/1972 | Broadbent | 264/1 |
| 3,795,534 | 3/1974 | Mehalso et al. | 117/101 |
| 3,855,426 | 12/1974 | Gijsbertus | 179/100.3 V |
| 4,124,672 | 11/1978 | Jarsen | 264/129 |
| 4,126,726 | 11/1978 | Soeding | 428/163 |
| 4,130,620 | 12/1978 | Jarsen | 264/225 |
| 4,199,421 | 4/1980 | Kamada et al. | 204/159.22 |
| 4,272,574 | 6/1981 | Lippits et al. | 428/64 |
| 4,296,158 | 10/1981 | Lewis | 428/65 |
| 4,304,806 | 12/1981 | Anderson et al. | 428/65 |
| 4,338,269 | 7/1982 | Russell | 204/159.16 |
| 4,363,844 | 12/1982 | Lewis et al. | 369/288 |
| 4,396,476 | 8/1983 | Roemer et al. | 204/159.16 |
| 4,421,619 | 12/1983 | Graham | 204/159.16 |
| 4,438,190 | 3/1984 | Ishimaru et al. | 204/159.16 |

*Primary Examiner*—John C. Bleutge
*Assistant Examiner*—A. H. Koeckert
*Attorney, Agent, or Firm*—Donald M. Sell; James A. Smith; Mark A. Litman

[57] ABSTRACT

Polymerizable compositions comprising monoethylenically unsaturated monomer, polyethylenically unsaturated monomer, a polymer soluble in the combination of monomers, and latent free-radical initiator provides good adhesion to substrates and durability. The composition is particularly useful in manufacturing video discs.

7 Claims, No Drawings

INFORMATION DISK OF GROOVED, METAL-COATED CROSSLINKED POLYMERIC LAYER

FIELD OF THE INVENTION

The present invention relates to compositions useful in the formation of information carrying systems and particularly to compositions useful in providing discs which carry light-readable or stylus-readable information thereon. These compositions are particularly useful as solventless, radiation curable formulations which are photocured in molds to produce information carrying surfaces.

BACKGROUND OF THE INVENTION

The use of light-readable (particularly laser-readable) or stylus-readable information has provided new products in the market place for information retrieval. The most successful form of this technology exists in the format of video discs. These are flat, circular sheets having information encoded thereon in a pattern of grooves which are light-readable or stylus-readable on at least one surface of the disc. The encoded information on the discs is translatable to electronic information which can be projected in visual form on a cathode screen. A popular format for this technology exists as video discs which contain encoded information that can be viewed on television screens in the form of movies, plays, business presentations, and the like.

Many different variations in the systems are known in the art, and substantial volumes of literature have been published disclosing the various techniques used to manufacture and read information stored in this manner. For example, U.S. Pat. No. 3,855,426 discloses a video disc recording and optical playback system therefore in which a beam of radiation is used to read information off an information track. It is to be noted that in this and other light-readable systems, it is common to include parallel tracks, one containing information to be converted to a visual signal and a second track used to assist the optical playback system in tracking the information properly. U.S. Pat. No. 4,126,726 also discloses a two-sided radiation-readable information carrying disc. U.S. patent application Ser. No. 117,467, filed Feb. 1, 1980, now U.S. Pat. No. 4,374,077, in the name of Donald J. Kerfeld discloses a process for forming information carrying discs which can be read either by optical or stylus means.

A number of differing methods are used to form the information carrying disc. Some of the earliest methods attempted direct impression of the information carrying surface structure into thermoplastic polymeric blanks as is still presently done in the phonograph record art. This type of process is shown in U.S. Pat. No. 3,658,954. Subsequent improvements in the processes of manufacturing video discs used liquid compositions which could be heat cured or radiation cured in molds to provide the information carrying structure. These types of processes are shown, for example, in U.S. Pat. Nos. 4,126,726; 4,272,574; 4,017,581; 4,130,620; 3,795,534 and 4,124,672.

A broad spectrum of compositions has been disclosed for use in the manufacture of the cured information carrying layer. Such various materials as thermoplastic vinyl resins (U.S. Pat. No. 3,658,954), acrylics, epoxies and other polymerizable materials (U.S. Pat. No. 4,124,672), epoxy-terminated silanes (U.S. Pat. No. 4,304,806) and polyacryloyl-containing heterocyclic monomers (U.S. Pat. No. 4,296,158) and photopolymerizable laquers (U.S. Pat. No. 4,126,726) have been shown in the literature.

In spite of the broad and extensive disclosure of structures, processes and compositions useful in the formation of information carrying substrates, problems still exist in the art. In particular, compositions used in forming the information carrying structure of the discs have shown problems with regard to adherence to the substrate onto which the information carrying structure is formed, extensive shrinkage during molding, and insufficient durability in normal use.

BRIEF DESCRIPTION OF THE INVENTION

The present invention relates to a polymerizable composition which is useful in molding processes and in particular is useful in the formation of information carrying substrates such as video discs. The polymerizable composition comprises a monoethylenically unsaturated monomer, a polyethylenically unsaturated monomer, a thermoplastic polymer soluble in a solution of the monomers, and a latent initiator for the ethylenically unsaturated materials. The polymerizable composition is preferably solvent free and provides excellent adhesion to polymethylmethacrylate substrates and polycarbonate substrates and is receptive to the vapor deposition of reflective metal layers.

DETAILED DESCRIPTION OF THE INVENTION

The composition of the present invention comprises a solution of monoethylenically unsaturated monomers, polyethylenically unsaturated monomers, a thermoplastic polymer soluble in the ethylenically unsaturated monomers, and a latent initiator for the ethylenically unsaturated monomers. Ethylenically unsaturated polymerizable materials are well known in the art. These materials include acryloyl, methacryloyl, allyl, and vinyl materials. Acryloyl and methacryloyl functional materials are generally preferred in the art.

Monoethylenically unsaturated monomers according to the present invention preferably have molecular weights between 80 and 500. Examples of monofunctional monomers according to the present invention are methylmethacrylate, methylacrylate, ethylacrylate, ethylmethacrylate, propylmethacrylate, n-butylacrylate, n-butylmethacrylate, tertbutylmethacrylate, 2-ethylhexylmethacrylate, stearylmethacrylate, cyclohexylmethacrylate, phenylmethacrylate, ethylcarbitolmethacrylate, butoxyethylmethacrylate, laurylacrylate, isobutylacrylate, tetrahydrofurfurylacrylate, 1,4-butane glycol monomethacrylate, and the like. Preferably the monofunctional acrylates will have a molecular weight between 150 and 250 according to the present invention.

The polyethylenically unsaturated monomers according to the present invention should generally have a molecular weight between 100 and 3,000. Examples of polyethylenically unsaturated materials according to the present invention include, for example, ethylene glycol diacrylate or dimethacrylate, 1,3-propane glycol diacrylate or dimethacrylate, 1,4-butanediol dimethacrylate or diacrylate, 1,6-hexanedioldimethacrylate or diacrylate, tetraethylene glycol dimethacrylate or diacrylate, neopentyl glycol dimethacrylate, 2,2-bis-(4-acryloxyethoxyphenyl) propane, 2,2-bis-(methacryloxyphenyl) propane, 2,2-bis-(4-acryloxy-(2-hydroxypropoxy) phenyl) propane, 2,2-bis-(4-methacryloxy(2-hydroxypropoxyethoxy) phenyl) propane, pentaerythrytol triacrylate or trimethacrylate, pentaerythrytol tetracrylate or tetramethacrylate, dipentaerythrytol triacrylate or trimethacrylate, dipentaerythrytol hexaacrylate or hexamethacrylate, trimethylol propane triacrylate or trimethacrylate, trimethylol ethane triacrylate or trimethacrylate, pentaglycerol triacrylate or trimethacrylate and the like. The polyethylenically unsaturated materials are preferably present as diethylenically unsaturated materials having a molecular weight between 100 and 2,000, and most preferably between 100 and 1,000.

Any film forming polymer which is soluble in the particularly selected monoethylenically unsaturated monomer and polyethylenically unsaturated monomer solution is useful in the practice of the present invention. Preferably acrylic thermoplastic polymeric materials are used in the practice of the present invention. These polymers should generally have a molecular weight of at least 10,000. Molecular weights as high as 500,000 or even a million may be used, but the preferred range is between 10,000 and 300,000. Homopolymers, copolymers, terpolymers and other materials formed by the combined reaction of different monomers are useful in the practice of the present invention. The polymer does not have to be reacted or reactable with the monomers, and in fact a substantial lack of reactive cites with the ethylenically unsaturated monomers is desirable in the polymer component. Particular polymers which are useful as this binder ingredient include homopolymers and copolymers of acrylates and methacrylates, homopolymers and copolymers of vinyl alcohol, vinyl chloride, vinyl acetate, polyesters, polyamides and polyethers. Particularly preferred polymers would include polyethylmethacrylate, polymethylmethacrylate and copolymer analogs of these materials. The terms acrylate polymer, methacrylate polymer, acrylic resin and methacrylic resin includes polymers having a multiplicity of monomer components as in copolymers, terpolymers, etc. as well as homopolymers. The thermoplastic polymer is generally used in amounts between 7.5 and 50 percent by weight of the total composition (taking into account only the monoethylenically unsaturated monomer and the polyunsaturaed monomer and the polymer). Preferably the polymer is present as 10 to 40 percent by weight of the total composition.

It is generally preferred that the ratio of the monoethylenically unsaturated monomer to the diethylenically unsaturated monomer exceed 1 to 7, is preferably greater than 1 to 6, and is most preferably greater than 1 to 5. The monoethylenically unsaturated monomer should likewise not be present in a ratio greater than 6 to 1, and preferably is present in a ratio of less than 4 to 1 with respect to the polyethylenically unsaturated monomer. The monoethylenically unsaturated monomer actually comprises between 7.5 and 45 percent of the composition and is preferably present as 10 to 40 percent by weight of the composition solids. The polyethylenically unsaturated monomer is actually present in the composition as 7.5 to 80 percent by weight of the composition, and is preferably present as 10 to 75 percent by weight of the composition. The polyethylenically unsaturated monomer also preferably has an ethylenically unsaturated equivalent weight of between 100 and 1,000, preferably between 100 and 500.

Any latent initiator may be used in the practice of the present invention, where that initiator is capable of polymerizing through ethylenic unsaturation. Both heat latent and radiation latent initiators are useful in the practice of the present invention, but radiation sensitive initiators, and particularly photoinitiators sensitive or sensitized to the infrared, visible or ultraviolet portions of the spectrum are preferred. Such free radical photoinitiators are well known in the art and include such materials as benzophenones, biimidiazoles, s-triazines, diazonium salts, iodonium salts, sulphonium salts, phosphonium salts, peroxides, and the like. These photoinitiators are generally used in amounts between 0.05 to 10 percent by weight of the composition, and in the practice of the present invention are preferably in amounts of 0.5 to 4 percent and most preferably 1 to 3 percent by weight of the composition. In addition to the free radical initiators themselves, dye sensitizers, as are known in the art, may also be used in combination with the free radical initiators. The use of such sensitizing dyes can broaden the spectral response of the composition and/or increase its sensitivity to curing radiation.

Other additives may be present in the composition of the present invention, such as coating aids, anti-oxidants, cure inhibitors, ultraviolet radiation absorbers, dyes, pigments, surfactants, antistatic agents and the like. The compositions of the present invention may be used without solvents, which is particularly desirable in the video disc art, but some solvent may be used if desired.

Viscosity of the compositions of the present invention should generally be between 20 and 20,000 centipoise at 20° C., preferably between 50 and 10,000 or 50 and 5,000, and most preferably between 500 and 1,000 centipoise.

It has been found that the combination of the three ingredients (the two monomers and the polymer binder) significantly improves the properties of the information carrying layer. The layer has been found to shrink less upon curing which reduces the stress in the information carrying layer. The composition shows increased adherence to polymethylmethacrylate, polycarbonate, and polyallyldiglycolcarbonate resin surfaces. The composition is also particularly receptive to the vapor deposition of metal reflective layers as is conventially done in the formation of the video discs. The composition is also quite durable to the stress and abrasion anticipated in the normal use of video discs.

These and other aspects of the present invention will be shown in the following non-limiting examples.

EXAMPLE 1

A solventless radiation curable formulation was prepared by combining 24.5 g of polyethylmethacrylate resin having an inherent viscosity of 0.2, 44.1 g of 1,6-hexane diol diacrylate, 29.4 g of 2,2-ethoxyethoxyethylacrylate and 2 grams dimethoxy phenyl acetophenone in a one half pint metal container. The can was shaken vigorously for two hours to produce a solution of the materlals having a viscosity of 390 cp. at 20° C. The solution was applied to a polymethylmethacrylate video disc substrate. The coating which had a thickness of 7.6 microns was allowed to sit on the substrate surface for sufficient time to flow out smoothly and to chemically contact the substrate surface. A rubber roll having a durometer hardness of 70 was used to press a metalized flexible polyester stamper into the coated composition. Ultraviolet radiation was projected through the stamper and into the composition while moving across the disc at a rate of 3.8 centimeters per second using a 125 watt per inch high intensity, medium pressure, mercury vapro lamp. The curing step was repeated a second time. The stamper was removed from the disc and the disc vacuum metalized with aluminum (50 millimicrons). The coating displayed excellent adhesion to the disc substrate and excellent adhesion to the aluminum film as measured by Cross Hatch tape test. The signal to noise ratio was measured and found to be within the range of 41–46 decibels. The disc was played on a disc player and produced a good video picture.

EXAMPLE 2

A solventless radiation curable formulation was prepared by combining 34.3 g of polyethylmethacrylate, 53.9 g of 1,6-hexanediol diacrylate, 9.8 g of 2,2-ethoxyethoxy-ethylacrylate and 2 g of dimethoxy phenyl acetophenone in a one half pint can as in Example 1. The formulation had a viscosity of 6,300 cp. and produced discs with adhesion and signal to noise the same as in Example 1.

EXAMPLE 3

A solventless radiation curable formulation was prepared by combining 34.3 g of polyethylmethacrylate, 44.1 g of 1,6-hexanediol diacrylate, 19.6 g of 2,2-ethoxyethoxy-ethylacrylate and 2 g of dimethoxy phenyl acetophenone in a one half pint can as in Example 1. The formulation viscosity was 4,900 cp. and produced discs with adhesion and signal to noise as in Example 1.

EXAMPLE 4

A solventless radiation curable formulation was prepared by combining 24.5 g of polyethylmethacrylate, 63.7 g of 1,6-hexanediol diacrylate, 19.6 g of 2,2-ethoxyethoxy-ethylacrylate and 2 g of dimethoxy phenyl acetophenone as in Example 1. The formulation had a viscosity of 530 cp. which made discs with signal to noise and adhesion the same as in Example 1.

EXAMPLE 5

A solventless radiation curable formulation was prepared by combining 31.4 g of polyethylmethacrylate, 39.2 g of 1,6-hexanediol diacrylate, 161. g of 2,2-ethoxyethoxy-ethylacrylate and 2 g of dimethoxy phenyl acetophenone as in Example 1. The formulation had a viscosity of 2,900 cp. which made discs with signal to noise and adhesion as in Example 1.

EXAMPLE 6

A solventless radiation curable formulation was prepared by combining 29.4 g of polyethylmethacrylate, 39.2 g of 1,6-hexanediol diacrylate, 29.4 g of 2,2-ethoxyethoxy-ethylacrylate and 2 g of dimethoxy phenyl acetophenone as in Example 1. This formulation was also made in volumes up to 3,000 grams with results the same as 100 gram batches. The formulation had a viscosity of 1,200 cp. which made discs with signal to noise and adhesion as in Example 1.

EXAMPLE 7

A solventless radiation curable formulation was prepared by combining 44.1 g of polyethylmethacrylate, 44.1 g of 1,6-hexanediol diacrylate, 9.8 g of 2,2-ethoxyethoxy-ethylacrylate and 2 g of dimethoxy phenyl acetophenone as in Example 1. The formulation had a viscosity of 98,000 cp. and was too viscous to process further or test.

EXAMPLE 8

A solventless radiation curable formulation was prepared by combining 24.5 g of polyethylmethacrylate, 63.7 g of 1,6-hexanediol diacrylate, 9.8 g of 2,2-ethoxyethoxy-ethylacrylate and 2 g of dimethoxy phenyl acetophenone as in Example 1. The formulation had a viscosity of 560 cp. which made copies which had only fair substrate adhesion but otherwise were the same as Example 1. The less than optimum substrate adhesion would mean this formulation is undesirable.

To show the improvement provided by the ternary composition of the present invention, binary systems using the materials and proportions of Example 8 were made and evaluated. The binary system with polyethylmethacrylate and 1,6-hexanediol diacrylate resulted in poor adhesion to the substrate. The binary system with polyethylmethacrylate and 2,2-ethoxyethoxy-ethylacrylate were too viscous, difficult to coat, and adhered poorly to the substrate. It is clearly surprising that a combination of the three ingredients adheres so well to the same substrate.

The structure of the information carrying discs usually comprises either a spiral or circular track of encoded information in the form of reflective bumps or depressions or a groove having encoded information in the form of bumps or depressions readable by a stylus. In the practice of the present invention, the term groove shall mean either the spiral or circular track or the grooved path used in the art. The dimensions disclosed in U.S. Pat. No. 4,304,806 for the dimensions of the grooves, bumps and depressions are incorporated herein by reference.

I claim:
1. An information carrying structure comprising a circular disc having information encoded in grooves on at least one metal coated surface thereof, the composition of the surface beneath the metal comprising the crosslinked reaction product of:
 a polymerizable composition free of non-polymerizable solvents comprising
  (a) 7.5 to 45 percent by weight of a monoethylenically unsaturated monomer having a molecular weight between 80 and 500,
  (b) 7.5 to 80 percent by weight of a diethylenically unsaturated monomer having a molecular weight between 100 and 3000,
  (c) 7.5 to 50 percent by weight of an organic polymer, non-reactive with (a) and (b), having a molecular weight of at least 10,000 which is soluble in a solution of (a) and (b), and
  (d) an effective amount of a latent free-radical initiator,
 the ratio of said monoethylenically unsaturated monomer to said diethylenically unsaturated monomer being greater than 1 to 7 and less than 6 to 1, and the viscosity of the composition being between 20 and 20,000 centipoise at 20° C.
2. The information carrying structure of claim 1 wherein the composition is adhered to a polymethylmethacrylate substrate.
3. The information carrying structure of claim 1 wherein said monoethylenically unsaturated monomer comprises a monoacrylyl or monomethacryloyl monomer and said diethylenically unsaturated monomer comprises a polyacryloyl monomer or polymethacryloyl monomer.

4. The information carrying structure of claim 1 wherein said polymer comprises a polyacrylate or polymethacrylate polymer.

5. The information carrying structure of claim 3 wherein the composition is adhered to a polymethylmethacrylate substrate.

6. The information carrying structure of claim 4 wherein the composition is adhered to a polymethylmethacrylate substrate.

7. An information carrying structure comprising a circular disc having information encoded in grooves on at least one metal coated surface thereof, the composition of the surface beneath the metal comprising the crosslinked reaction product of:

a polymerizable composition free of non-polymerizable solvents consisting essentially of (a) 7.5 to 45 percent by weight of a monoethylenically unsaturated monomer having a molecular weight between 80 and 500, (b) 7.5 to 80 percent by weight of a diethylenically unsaturated monomer having a molecular weight bewteen 100 and 3000, (c) 7.5 to 50 percent by weight of an organic polymer, non-reactive with (a) and (b), having a molecular weight of at least 10,000 which is soluble in a solution of (a) and (b), and (d) an effective amount of a latent free-radical initiator, the ratio of said monoethylenically unsaturated monomer to said diethylenically unsaturated monomer being greater than 1 to 7 of less than 6 to 1, and the viscosity of the composition being between 20 and 20,000 centipoise at 20° C.

* * * * *

UNITED STATES PATENT AND TRADEMARK OFFICE
CERTIFICATE OF CORRECTION

PATENT NO. : 4,510,593

DATED : April 9, 1985

INVENTOR(S) : Michael P. Daniels

It is certified that error appears in the above-identified patent and that said Letters Patent is hereby corrected as shown below:

Column 6, line 67, "monoacrylyl" should read --monoacryloyl--.

Signed and Sealed this

Twelfth Day of November 1985

[SEAL]

Attest:

Attesting Officer

DONALD J. QUIGG

Commissioner of Patents and Trademarks